United States Patent

Lukin

(10) Patent No.: US 9,225,310 B1
(45) Date of Patent: Dec. 29, 2015

(54) AUDIO LIMITER SYSTEM AND METHOD

(71) Applicant: iZotope, Inc., Cambridge, MA (US)

(72) Inventor: Alexey Lukin, Moscow (RU)

(73) Assignee: iZotope, Inc., Cambridge, MA (US)

( * ) Notice: Subject to any disclaimer, the term of this patent is extended or adjusted under 35 U.S.C. 154(b) by 231 days.

(21) Appl. No.: 14/075,759

(22) Filed: Nov. 8, 2013

Related U.S. Application Data

(60) Provisional application No. 61/724,052, filed on Nov. 8, 2012.

(51) Int. Cl.
*H03G 9/20* (2006.01)
*H03G 11/00* (2006.01)

(52) U.S. Cl.
CPC . *H03G 9/20* (2013.01); *H03G 11/00* (2013.01)

(58) Field of Classification Search
CPC ....... H03G 11/00; H03G 3/345; H03G 9/025; H04B 1/1027; G11B 20/02
See application file for complete search history.

(56) References Cited

U.S. PATENT DOCUMENTS

| | | | | |
|---|---|---|---|---|
| 6,363,338 B1* | 3/2002 | Ubale | ................... | G10L 19/002 704/200.1 |
| 7,398,204 B2* | 7/2008 | Najaf-Zadeh | ......... | G10L 19/032 704/200.1 |
| 2003/0220783 A1* | 11/2003 | Streich | ..................... | H04B 1/66 704/200.1 |
| 2004/0184369 A1* | 9/2004 | Herre | ...................... | G10L 19/02 369/47.1 |
| 2004/0184537 A1* | 9/2004 | Geiger | .................. | G10L 19/032 375/240.11 |
| 2005/0271367 A1* | 12/2005 | Lee | ..................... | G10L 21/0364 386/239 |
| 2009/0161882 A1* | 6/2009 | Le Faucher | ............. | G10L 25/69 381/56 |
| 2011/0046966 A1* | 2/2011 | Dalimba | ............... | G10L 19/035 704/503 |

\* cited by examiner

*Primary Examiner* — Simon Sing
(74) *Attorney, Agent, or Firm* — David Lowry

(57) ABSTRACT

A system and method for limiting amplitude of a signal, such as limiting the loudness of an audio signal. Embodiments of the present invention allow for the most aggressive limiting by using an advanced psychoacoustic model to intelligently determine the amount of limiting that can be done to the incoming signal before producing distortion that is detectable to the human ear.

16 Claims, 3 Drawing Sheets

AUDIO LIMITER SYSTEM AND METHOD

This application claims priority to provisional U.S. Application Ser. No. 61/724,052 filed on Nov. 8, 2012, which is fully incorporated herein by reference.

FIELD OF THE INVENTION

The invention relates generally to signal processing. More specifically, the invention is directed towards a system and method for compressing and/or limiting audio signals.

BACKGROUND OF THE INVENTION

In the fields of audio and music, it is fairly common to apply some type of dynamics processing to audio. Dynamic processing generally focuses on the volume of audio, but not necessarily in a linear fashion. In general, a dynamics processor takes an input audio signal, and produces an output audio signal with the amplitude (volume) adjusted, typically with some time-varying gain.

A common type of dynamics processing is known as compression, wherein the higher the input signal level, the higher the attenuation. Many compressors work using a threshold, in that when the input signal increases in magnitude and crosses the threshold, the attenuation increases by some ratio. Typically, compressors measure signal magnitude by RMS to get an average of the signal energy, although other magnitude measurements, such as peak value, can also be used.

One specific type of compressor is known as a limiter. Limiters typically have a goal of preventing the audio signal from going above a specific threshold, or ceiling. For digital audio signals, the ceiling set by the bit count cannot be exceeded without distorting the signal. This distortion is known as clipping, in that the signal is "clipped off" without reaching its real peak amplitude. Clipping is undesirable not only because of the distortion it causes, but also the loss in the data signal may not be recoverable.

Limiters work by attenuating the signal before it reaches a peak value. Typically limiters respond much faster than compressors, both in reacting to an increased signal (the attack), and then in returning to normal (release) after the input signal drops below the threshold. Limiters often respond to the peak value of a signal instead of the average or RMS value.

An advantage of limiters is that by preventing the signal for going above a certain threshold, the signal strength can be raised to utilize the signal bandwidth available. In audio signal, this can also be used to increase the perceived "loudness" of a signal, an effect often applied for high quality audio. Sometimes this effect is overly applied to audio and music, resulting in the music sounding "squashed", but if done carefully, this limiting can help make the audio sound more full, without overly minimizing the dynamic range.

Limiters have a disadvantage that if applied aggressively, they can make the audio sound very bad and unnatural. Based on parameter settings, limiters can cause audible distortion and other unwanted effects, such as pumping. To be useful, such bad effects of limiters must be minimized.

BRIEF SUMMARY OF THE INVENTION

The following presents a simplified summary of the invention in order to provide a basic understanding of some aspects of the invention. This summary is not an extensive overview of the invention. It is not intended to identify key or critical elements of the invention or to delineate the scope of the invention. The following summary merely presents some concepts of the invention in a simplified form as a prelude to the more detailed description provided below.

Embodiments of the present invention include a method for limiting an audio signal, which may comprise applying a psychoacoustic model to a portion of the audio signal, to produce masking thresholds for a plurality of critical frequency bands, generating a plurality of different amplitude envelopes for the portion of the audio signal, and then for each of the plurality of amplitude envelopes, performing one or more of the following steps: applying the amplitude envelope to the audio signal portion to produce a limited audio signal portion, producing a distortion signal by comparing the audio signal portion to the limited audio signal portion, calculating distortion signal power for the plurality of critical frequency bands, and comparing the plurality of distortion signal power for critical frequency bands against the plurality of masking thresholds to produce a distortion score. Other steps include selecting one of the limited audio signal portions based its corresponding distortion score.

Other embodiments may include features such as normalizing the limited audio signal portions before producing a distortion signal, selecting one of the limited audio signal portions whose corresponding distortion score is below a pre-selected threshold value, and wherein the audio signal is limited to not exceed a predetermined amplitude threshold that does not change. For one or more embodiments, the critical frequency bands cover a full range of audible frequencies. For some embodiments, the psychoacoustic model is configured to raise masking levels around transients in the audio signal, or the psychoacoustic model calculates and utilizes a tonality index for the audio signal.

Other embodiments may include a non-transitory computer-readable storage medium having instructions, that when executed by a processor, cause the processor to perform a method of using a psychoacoustic model to analyze a portion of an audio signal, to produce masking thresholds for a plurality of critical frequency bands, applying a plurality of different amplitude envelopes to the portion of the audio signal, producing distortion levels by comparing the original audio signal to the limited signals, and determining a distortion score by dividing the distortion levels into critical listening bands and adjusting them by the masking thresholds. One of the limited audio signals is then selected based on the distortion score.

Other embodiments include an audio limiter, which includes a psychoacoustic model component, configured to analyze a portion of an audio signal, and produce masking thresholds for a plurality of critical frequency bands; and an envelope generating component, configured to generate a plurality of different amplitude envelopes. It may also include a distortion calculating component, that is configured to apply each of the different amplitude envelopes to the portion of audio signal to produce a limited audio signal; create a distortion signal by comparing the limited audio signal to portion of the audio signal, calculate distortion signal power for a plurality of critical frequency bands for the distortion signal, and calculate a distortion score by comparing the distortion power to the masking thresholds for the plurality of critical bands. It may also include a selection component, configured to receive the distortion scores for the plurality of limited audio signals, and to select one of the limited audio signals based on its distortion score.

Advantages of the present invention include a limiter that is optimized to preserve transients, so they sound sharper and clearer in the output audio signal, even when aggressive limiting or maximizing is taking place. An advanced psychoacoustic model can intelligently determine the amount of limiting that can be done to the incoming signal before producing distortion that is detectable to the human ear.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF THE INVENTION

Figure 1:
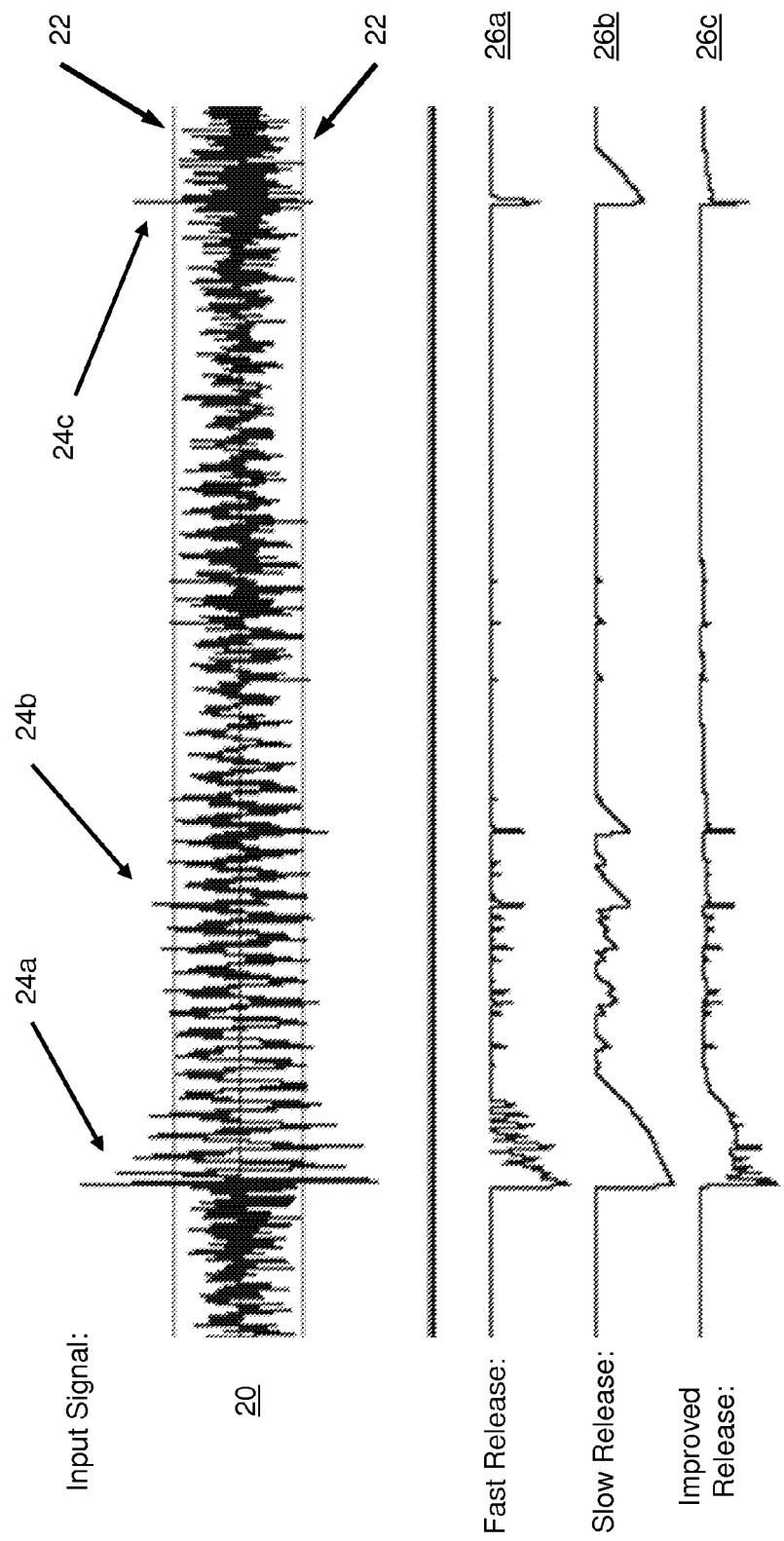
FIG. 1 illustrates a sample waveform to be limited, and some example gain envelopes for it.

In the following description of the various embodiments, reference is made to the accompanying drawings, which form a part hereof, and in which is shown by way of illustration various embodiments in which the invention may be practiced. It is to be understood that other embodiments may be utilized and structural and functional modifications may be made without departing from the scope of the present invention.

The operation of a dynamics processor can be generally described as two steps: the processing device detects the input signal level and dynamically adjusts the output level, i.e. applies a certain time-varying gain envelope to the signal. For a high fidelity sound, a few requirements must be maintained. One important requirement is that the gain envelope should be smooth, without breaks or sharp bends. Indeed, if the gain envelope has breaks, then the output signal will have breaks in the waveform, audible as clicks or crackle. Sharp bends in the gain envelope can also lead to signal distortion.

For smoothing of gain envelope, dynamics processors typically have two parameters: attack time and release time. They define the reaction speed of the system to changes of the input level. The attack time means the reaction time to the input levels rising above the threshold (attack), and the release time means the reaction time to the input levels going below the threshold again.

The speeds of the attack and release times are very important. For audio with many transients, a fast attack and/or release time can reduce the pumping effect. But to avoid intermodulation distortion, a slow attack and/or release time is desired, especially if deep limiting is to be applied. So, the choice of attack/release time is a trade-off between intermodulation distortion and pumping artifact.

A desired property of limiters is to maximize the audio, which requires aggressive limiting. For example, a first maximizer is more aggressive than a second maximizer if at the same setting of the threshold, the first maximizer produces louder output audio (judged by RMS levels) than the second. Clearly, aggressiveness depends on the attack/release time and on the shape of the gain envelope during attack/release states.

In most maximizers, the user manually sets attack and release time after selecting the threshold level. If intermodulation distortion becomes audible, the aggressiveness is reduced by increasing attack/release time. If the distortion is inaudible, a higher aggressiveness can be attempted in order to achieve higher loudness and less pumping. Deeper (more aggressive) limiting often requires longer attack/release times to avoid distortion.

One way to automatically adjust the aggressiveness of the maximizer by the analysis of the input audio signal. Indeed, if the input signal has sharp transients, a higher aggressiveness is beneficial for reduction of pumping. Intermodulation distortion will not happen in this case, because infrequent short peaks will not cause periodic changes in the gain envelope, leading to intermodulation distortion. Moreover, the human ear has low sensitivity to short-term (less than 6 ms) distortions. In this way, the maximizer can quickly react to single transient peaks and quickly return to the unity gain.

On the other hand, if the input signal contains frequent, periodic over-threshold spikes, then the aggressiveness of the maximizer should be reduced (by increasing the attack/release time), to avoid distortion.

If such an adjustment of aggressiveness is performed adaptively, using the analysis of the input signal, then the average aggressiveness of the maximizer can be significantly increased without audible distortion.

FIG. 1 shows a sample input signal 20 that is to be limited. The limiting threshold is illustrated by the outside lines 22. This threshold is typically set by the user. When the input signal 20 reaches or exceeds the threshold 22, it is to be dynamically limited so that the processed output signal does not exceed the threshold 22 at any time. Various example gain envelopes 26 are illustrated. A gain envelope shows the variable gain reduction to be applied to the input signal 20 in order to prevent the input signal 20 from exceeding the threshold 22.

The first gain envelope 26a illustrates a fast release time. The envelope gain reduction quickly decreases after responding to peaks, for example to peaks 24a and 24c in input signal 20. Such aggressive changes in the gain envelope can cause intermodulation distortion to occur when the input signal 20 is limited. The second gain envelope 26b illustrates a slow release time. The envelope gain reduction still responds quickly to peaks, but is slow about reducing back to the normal (no gain reduction) level afterwards. For a transient spike as shown by peak 24b, the slow recovery time provided by gain envelope 26b can result in an undesirable effect called "pumping" to occur in the output signal.

The third gain envelope 26c illustrates an example of auto release control, wherein the release time varies depending upon the input signal 20. A feature of the present invention is to produce such gain envelopes that allow aggressive limiting of an input signal but without causing intermodulation distortion or pumping, or other artifacts that are undesirable.

Figure 2:
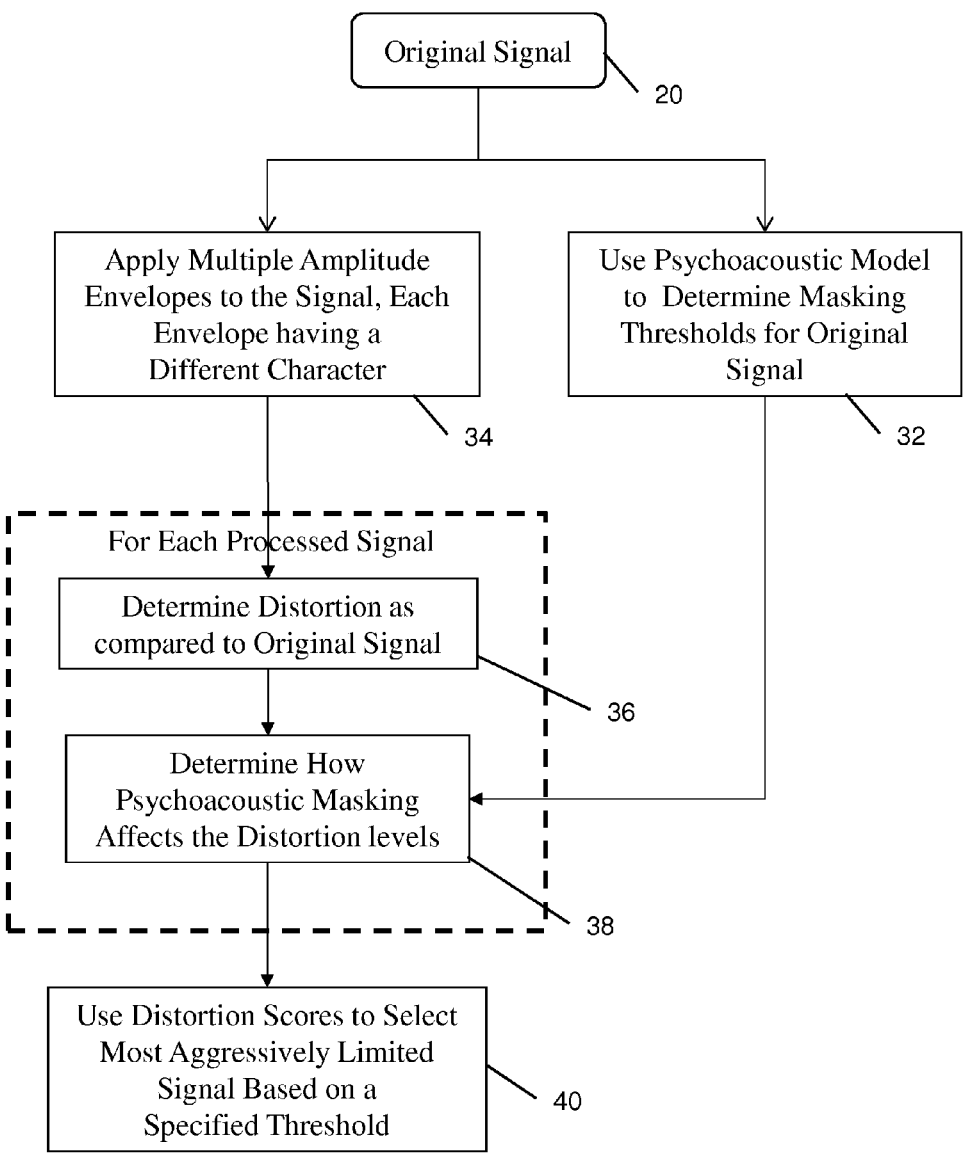
FIG. 2 illustrates steps performed by one or more embodiments of the present invention.

FIG. 2 shows a method performed by one or more embodiments of the present invention. For an original input signal 20, multiple envelopes are created with various parameter speeds, so that the created envelopes span the whole spectrum of settings: from "clipping" to "slowest, most transparent". In order to effectively choose the suitable envelope for each section of the audio data, a psychoacoustic model is employed, step 32. In one or more embodiments, a main goal is to provide as aggressive limiting as possible, but without causing noticeable distortion. The goal of psychoacoustic model is to evaluate the audibility of distortion produced by each of those created envelopes.

In one or more embodiments, for each time frame, 6 to 8 individual amplitude envelopes are constructed for the same input signal, each envelope with different character settings spanning the whole range of available characteristics. Some variations on character include fast attack/release, fast attack/slow release, and also envelopes designed for neutral or transparent limiting, for example reacting quickly to transients to prevent pumping, and reacting more slowly to steady bass tones to prevent distortion.

These envelopes are then each applied to the input signal 20, step 34. The resulting output signal from each envelope is analyzed against the original input signal 20, to determine the distortion now in the output signal, step 36. In one or more embodiments, the distortion signal is calculated in critical bands of human hearing. Then at step 38, masking thresholds determined from the psychoacoustic model are used to evaluate distortion results in each critical band, to produce a distortion score for each candidate envelope. In one or more embodiments approximately 24 critical bands are utilized.

At step 40, the distortion scores are evaluated and the "best" output is selected. In one or more embodiments, the most aggressively limited signal whose distortion score is still below a user-specified audibility threshold is chosen as the "best" signal for this time frame. Processing is then repeated for the next time frame.

In one or more embodiments, this process may be applied continuously to an audio signal in real time, subject to some latency. If more latency or off-line processing is an option, more candidate envelopes and processing are possible.

Figure 3:
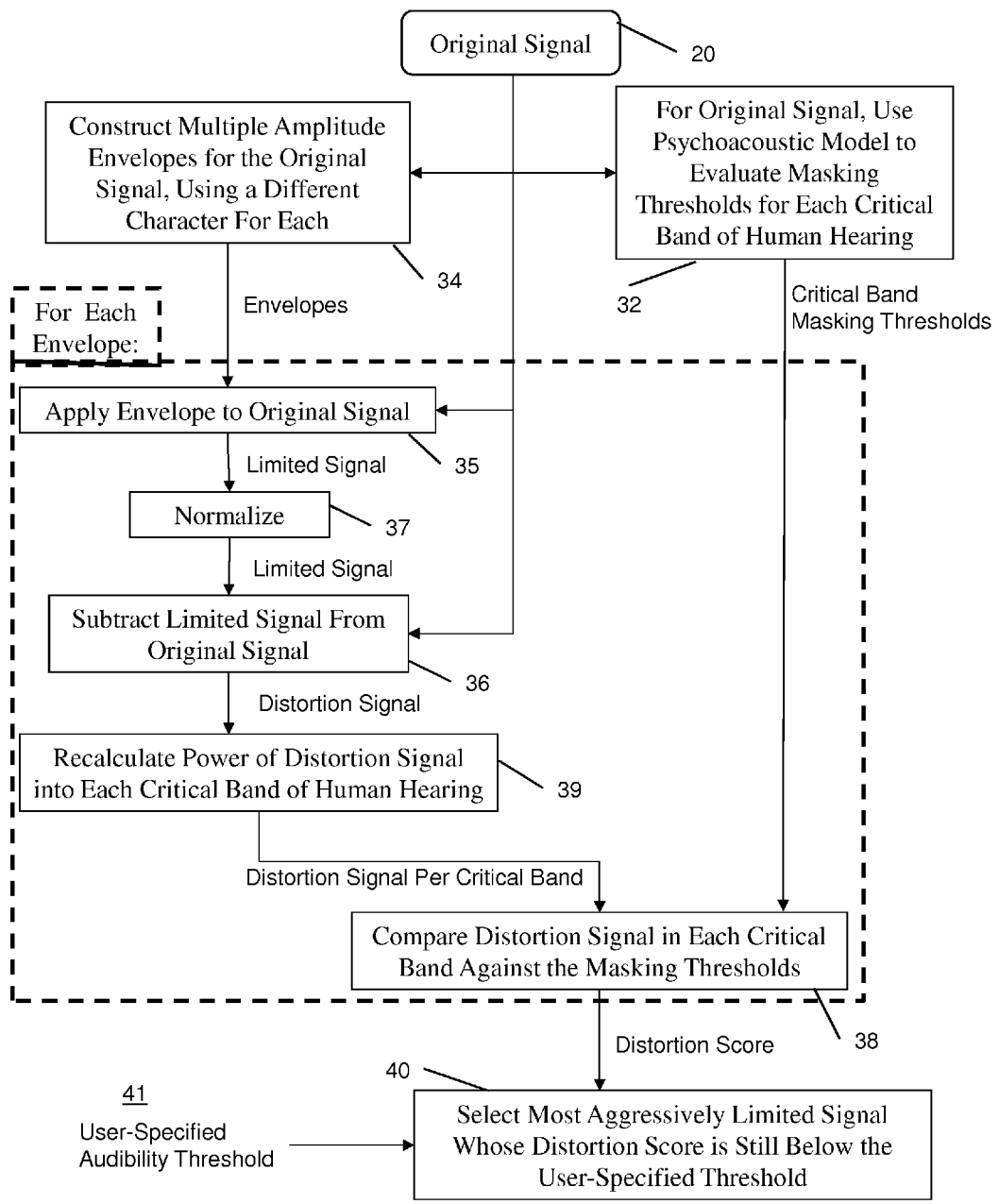
FIG. 3 illustrates details steps performed by one or more embodiments of the present invention.

FIG. 3 provides more details for one or more embodiments of the present invention. A time frame of an input signal 20 is evaluated using a psycho-acoustic model to evaluate masking thresholds induced by the original signal in each critical band of the human hearing, step 32. In one or more embodiments, the psychoacoustic model used is a standard-type subband model described in P. Kabal's "An Examination and Interpretation of ITU-R BS.1387: Perceptual Evaluation of Audio Quality, 2002-05-01", which is available at http://www.mp3-tech.org/programmer/docs/kabalr2002.pdf. One or more embodiments implement the "Advanced" (¼-bark) version of the FFT-based ear model. It includes windowing a signal, applying the FFT transform, modeling of the outer and middle ear, critical band decomposition, tonality index calculation (not present in Kabal's paper), frequency spreading, forward and limited backward time-domain spreading.

Embodiments of the present invention implement special features of the psychoacoustic model not described in Kabal's paper. The first such feature is the calculation of the tonality index, which has a profound effect on masking levels. It involves:

a. The Input signal spectrum is frequency-smoothed with Hann filter with a radius of 24 bins.

b. The Input signal spectrum is divided by the smoothed spectrum from step (a).

c. For each critical band, an embodiment considers a frequency window centered on this band and having a diameter of 4 barks. In this window, the embodiment calculates the sparsity measure of the spectrum obtained in step (b). The sparsity measure may be evaluated as:

$$S = \frac{N \sum_{i=1}^{N} |X_i|^2}{\left(\sum_{i=1}^{N} |X_i|\right)^2}$$

where N is the number of bins in the frequency window, $X_i$ are the magnitude FFT coefficients from step (b).

d. The instantaneous tonality index for each critical band is evaluated as $$T = \sqrt{\text{Ramp}(S, 0.3, 8)},$$

$$\text{where Ramp}(x, a, b) = \begin{cases} 0, & x \leq a \\ 1, & x \geq b \\ (x-a)/(b-a), & \text{otherwise} \end{cases}$$

e. The time-averaged tonality index is obtained by smoothing the instantaneous tonality index with a time-symmetric Hann filter with a radius of 6 FFT blocks (FFT blocks have an overlap of 75%).

The second special feature of one or more embodiments includes enhancement of transient sensitivity. The existing psychoacoustic model has a fixed window size, which spreads the energy of transients in time and prevents accurate calculation of threshold levels. An embodiment sharpens the response of the model to transients, which raises masking levels around transients.

a. The energy in critical bands is smoothed with a Hann filter having a radius of 3 barks.

b. The frequency-smoothed energy from step (a) is time-smoothed with a Hann filter with a radius of 6 FFT blocks (FFT blocks have an overlap of 75%).

c. If the current value of energy from step (b) is higher than the previous value (for the previous block of time), then the new value is modified to be a maximum of the current value.

The result of the processing is a set of critical band masking thresholds that will be used for the result of various limiting envelopes on the input audio signal 20.

As previously described with FIG. 2, at step 34 a plurality of individual amplitude envelopes are constructed for the same original signal 20 using with different "Character" settings spanning the whole range of available Characters. Each envelope is used to process the original signal 20 for the time frame under analysis, step 35, to produce a limited output signal. In order to determine the difference between the original signal 20 and the limited output signal, the energies of each of limited output signal from step 35 is normalized to match the energy of the original signal 20. Then each output signal is subtracted from the original signal 20 in order to form difference (distortion) signals, step 36.

The power of distortion signals is then recalculated into critical bands of the human hearing, step 39 and then (step 38) compared with the masking thresholds produced by the psychoacoustic model in step 22, to produce distortion scores corresponding to each candidate envelope produced at step 34. An advantage for one or more embodiments is that if a band is partially or fully masked in the psychoacoustic model, more distortion can be allowed in that band.

For one or more embodiments, users may specify an audibility threshold to determine how much distortion may be tolerated in the output signal. At step 40, the most aggressively limited signal whose distortion score is still below the user-specified audibility threshold is chosen as the "best" signal for this time frame.

For one or more embodiments, users may select between a number of Character "styles" which will help to manage the limiter's final sound by constraining its release behavior. Such styles include "Pumping" which is the least aggressive style setting and does not constrain the limiter's release behavior. It can tend toward a slower release behavior and may result in pumping. Another style includes "Balanced"

which constrains the release behavior of the limiter in a generally transparent way and should be suitable for most material. A next style is "Crisp", which aggressively constrains the limiter's release behavior and will favor distortion over any pumping. This setting may add more "body" to a mix at the risk of occasionally perceivable distortion. A final style is "Clipping". This is the most aggressive style setting of some embodiments and may be used if a user wishes to slightly colorize their mix with distortion or achieve the highest degree of loudness with the greatest risk of clipping.

Although described in terms of compression and limiting, embodiments of the present invention may be utilized for other types of audio and signal processing. For example, using psychoacoustic masking thresholds to adjust critical band distortion ratings may be used for all areas of audio processing, such as equalization, etc.

In one or more embodiments, the present invention may be implemented as a software plug-in to be used for audio processing such as for a DAW (Digital Audio Workstation) that can run on a general purpose computer, or with special hardware. The plug-in communicates with the DAW in one of several standardized data-exchange protocols such as VST, AU, RTAS, Direct-X, and AAX. Alternatively, embodiments of the present invention may be built directly into DAWs or other audio processing software products. The processing may be done locally on a personal computer, or remotely such as a server or on a cloud system on the internet or other networking system. Further, embodiments of the present invention may be implemented in hardware, including DSP chips and hardware.

One or more aspects of the invention may be embodied in computer-usable data and computer-executable instructions, such as in one or more program modules, executed by one or more computers, processors, or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Further, embodiments may be embedded in the hardware or firmware of new equipment.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. A method performed by a processor for limiting an audio signal, comprising:
    applying a psychoacoustic model to a portion of the audio signal, to produce masking thresholds for a plurality of critical frequency bands;
    generating a plurality of different amplitude envelopes for the portion of the audio signal;
    for each of the plurality of amplitude envelopes:
        applying the amplitude envelope to the audio signal portion to produce a limited audio signal portion;
        producing a distortion signal by comparing the audio signal portion to the limited audio signal portion;
        calculating distortion signal power for the plurality of critical frequency bands; and
        comparing the plurality of distortion signal power for critical frequency bands against the plurality of masking thresholds to produce a distortion score; and
    selecting one of the limited audio signal portions based its corresponding distortion score.

2. The method of claim 1 wherein each of the plurality of limited audio signal portions are normalized before producing a distortion signal.

3. The method of claim 1 wherein the step of selecting one of the limited audio signal portions includes selecting one of the limited audio signal portions whose corresponding distortion score is below a pre-selected threshold value.

4. The method of claim 1 wherein the audio signal is limited to not exceed a predetermined amplitude threshold that does not change.

5. The method of claim 1 wherein the critical frequency bands cover a full range of audible frequencies.

6. The method of claim 1 wherein the psychoacoustic model is configured to raise masking levels around transients in the audio signal.

7. The method of claim 1 wherein the psychoacoustic model calculates and utilizes a tonality index for the audio signal.

8. A non-transitory computer-readable storage medium having instructions, that when executed by a processor, cause the processor to perform a method comprising:
    applying a psychoacoustic model to a portion of an audio signal, to produce masking thresholds for a plurality of critical frequency bands;
    generating a plurality of different amplitude envelopes;
    for each of the plurality of amplitude envelopes:
        applying the amplitude envelope to the audio signal portion to produce a limited audio signal portion;
        producing a distortion signal by comparing the audio signal portion to the limited audio signal portion;
        calculating distortion signal power for the plurality of critical frequency bands; and
        comparing the plurality of distortion signal power for critical frequency bands against the plurality of masking thresholds to produce a distortion score; and
    selecting one of the limited audio signal portions based its corresponding distortion score.

9. The non-transitory computer-readable storage medium of claim 8 further including instructions wherein each of the plurality of limited audio signal portions are normalized before producing a distortion signal.

10. The non-transitory computer-readable storage medium of claim 8 further including instructions wherein the step of selecting one of the limited audio signal portions includes selecting one of the limited audio signal portions whose corresponding distortion score is below a pre-selected threshold value.

11. The non-transitory computer-readable storage medium of claim 8, wherein the audio signal is limited to not exceed a predetermined amplitude threshold that does not change.

12. The non-transitory computer-readable storage medium of claim 8, further including instructions wherein the critical frequency bands cover a full range of audible frequencies.

13. The non-transitory computer-readable storage medium of claim 8, wherein the psychoacoustic model is configured to raise masking levels around transients in the audio signal.

14. The non-transitory computer-readable storage medium of claim 8, wherein the psychoacoustic model calculates and utilizes a tonality index for the audio signal.

15. An audio limiter, comprising:
a psychoacoustic model component, configured to analyze a portion of an audio signal, and produce masking thresholds for a plurality of critical frequency bands;
an envelope generating component, configured to generate a plurality of different amplitude envelopes;
a distortion calculating component, configured to:
apply each of the different amplitude envelopes to the portion of audio signal to produce a limited audio signal,
create a distortion signal by comparing the limited audio signal to portion of the audio signal,
calculate distortion signal power for a plurality of critical frequency bands for the distortion signal, and
calculate a distortion score by comparing the distortion power to the masking thresholds for the plurality of critical bands; and
a selection component, configured to receive the distortion scores for the plurality of limited audio signals, and to select one of the limited audio signals based on its distortion score.

16. The audio limiter of claim 15, wherein the psychoacoustic model is configured to raise masking levels around transients in the audio signal.

* * * * *